United States Patent
Siao

(12) 
(10) Patent No.: US 8,503,252 B2
(45) Date of Patent: Aug. 6, 2013

(54) SENSE AMPLIFIER CIRCUIT

(75) Inventor: Yuan-Long Siao, Luzhu Township (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 118 days.

(21) Appl. No.: 13/149,636

(22) Filed: May 31, 2011

(65) Prior Publication Data

US 2012/0307571 A1    Dec. 6, 2012

(51) Int. Cl.
*G11C 7/06* (2006.01)

(52) U.S. Cl.
USPC .............. 365/189.07; 365/205; 365/207

(58) Field of Classification Search
USPC ............. 365/189.07, 205, 207, 203; 327/51, 327/52

See application file for complete search history.

(56) References Cited

U.S. PATENT DOCUMENTS

| | | | | |
|---|---|---|---|---|
| 4,434,381 A | * | 2/1984 | Stewart | 327/57 |
| 2008/0084758 A1 | * | 4/2008 | Wang | 365/185.21 |

* cited by examiner

*Primary Examiner* — Huan Hoang
(74) *Attorney, Agent, or Firm* — Slater & Matsil, L.L.P.

(57) ABSTRACT

A sense amplifier circuit comprises a first inverter configured to provide a first trigger point during a pre-charge stage of a READ operation of a memory cell and provide a second trigger point either lower or higher than the first trigger point during a sense stage of the READ operation of the memory cell. The sense amplifier circuit further comprises a plurality of inverters coupled between an output of the first inverter and an output of the sense amplifier and a pre-charge device. The sense amplifier circuit having a dynamic trigger point can deliver faster data access time as well as less power consumption.

10 Claims, 8 Drawing Sheets

SENSE AMPLIFIER CIRCUIT

BACKGROUND

Modern electronic devices such as a notebook computer comprise a variety of memories to store information. Memory circuits include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them permanently unless an electrical charge is applied to non-volatile memories. Non-volatile memories include a variety of sub-categories, such as electrically erasable programmable read-only memory (EEPROM) and flash memory.

A flash memory comprises a plurality of memory cells arranged in rows and columns. Each memory cell stores a bit of information by means of a floating gate transistor. A sense amplifier is used to verify the logic state of a memory cell by comparing a memory cell current with a reference current. More particularly, a voltage potential is applied to the control gate of the memory cell and then a current flows through the memory cell in response to the voltage change at the control gate. The sense amplifier detects the current flowing through the memory cell and compares it with a predetermined reference current. When the memory cell current is more than the reference current, the sense amplifier reports a logic high, which means the memory cell stores a logic high state. In contrast, when the memory cell current is less than the reference current, the sense amplifier reports a logic low, which reflects the logic low state of the memory cell.

Sense amplifiers include voltage mode sense amplifiers and current mode sense amplifiers. In a voltage mode sense amplifier, both a memory cell current and a reference current are converted into the corresponding voltages and further fed into the inputs of the voltage mode sense amplifier. The READ operation of the memory cell is performed by comparing the two voltages at the inputs of the voltage mode sense amplifier. The voltage mode sense amplifier reports the logic state of the memory cell based upon the comparison result.

In contrast, a current mode sense amplifier directly compares a memory cell current with a reference current. In a READ operation of a memory cell, a complementary metal-oxide-semiconductor (CMOS) inverter may be used to monitor the difference between the memory cell current and the reference current. More particularly, the inverter's input is coupled to both the reference current and the memory cell current. Furthermore, the difference between the reference current and the memory cell current is used to charge the input of the inverter. In accordance with the operation of flash memory circuits, when a memory cell stores a logic low state, the reference current is more than the memory cell current. As a result, the difference between the reference current and the memory cell current is a positive value, which means a charge current charges the input of the inverter to a level more than the trigger point of the inverter so that the current mode sense amplifier reports a logic low state. In contrast, when the memory cell stores a logic high state, the reference current is less than the memory cell current. As a result, the difference between the reference current and the memory cell current is a negative value, which means a discharge current discharging the input of the inverter down to a level below the trigger point of the inverter so that the current mode sense amplifier reports a logic high state.

In a READ operation, the access time of detecting a logic state stored in a memory cell is a key performance index for a memory circuit. A sense amplifier having a shorter sense time may cut the total access time so that the performance of the memory circuit is improved. Moreover, the power consumption of a memory circuit has become one of major challenges in designing high performance memory circuits. As a result, a sense amplifier consuming less power may contribute to the total power saving of a memory circuit.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a current mode sense amplifier in a flash memory circuit. The invention may also be applied, however, to a variety of sense amplifiers in different types of memory circuits.

Figure 1:
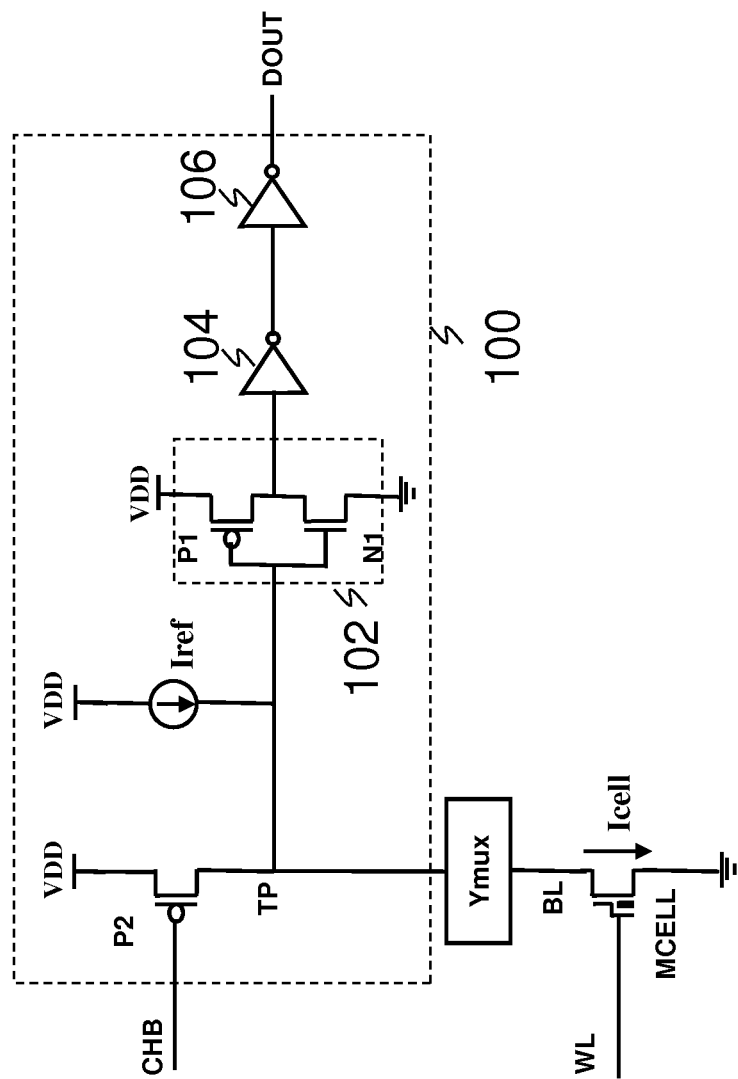
FIG. 1 illustrates a simplified schematic diagram of an exemplified current mode sense amplifier.

Referring initially to FIG. 1, a simplified schematic diagram of an exemplified current mode sense amplifier is shown. The current mode sense amplifier 100 comprises a P-channel metal-oxide semiconductor (POMS) device P2, a reference current source $I_{ref}$, a first inverter 102, a second inverter 104 and a third inverter 106. As shown in FIG. 1, the first inverter 102 further comprises a PMOS device P1 and an N-channel metal-oxide semiconductor (NOMS) device N1 connected in series. The source of the PMOS device P1 is coupled to a voltage potential VDD. The drain of the PMOS device P1 and the drain of the NMOS device N1 are tied together forming an output of the first inverter 102. Furthermore, the output of the first inverter 102 is coupled to an output of the current mode sense amplifier 100 via the second inverter 104 and the third inverter 106.

Both the gate of the PMOS device P1 and the NMOS device N1 are coupled to TP, which is a junction point between the PMOS device P2 and the reference current source $I_{ref}$. The reference current source $I_{ref}$ has one terminal tied to TP and the other terminal coupled to the voltage potential VDD. The PMOS device P2 has a source terminal coupled to the voltage potential VDD, a drain terminal connected to TP and a gate terminal coupled to a control signal CHB. As illustrated in FIG. 1, the current mode sense amplifier 100 is coupled to a memory cell MCELL via a Y multiplexer YMUX. The Y multiplexer YMUX includes a plurality of switching devices to connect TP to a relevant bit line BL and the corresponding memory cell (e.g., MCELL).

Figure 2A:
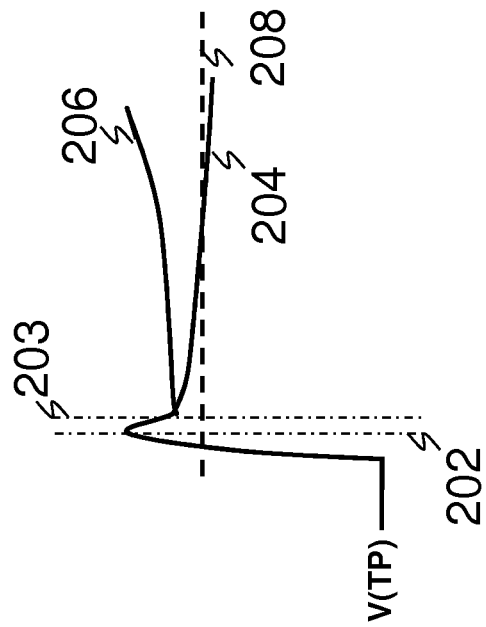
FIGS. 2A and 2B illustrate the operation of the current mode sense amplifier shown in FIG. 1.
Figure 2B:
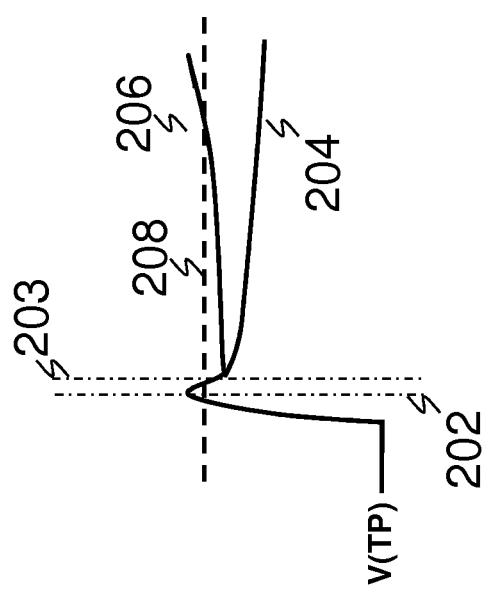

FIGS. 2A and 2B illustrate the operation of the current mode sense amplifier 100 shown in FIG. 1. In a READ operation of a memory cell, the current sense amplifier 100 detects the cell current flowing through a memory circuit, and then compares the memory cell current with a reference current so as to determine the logic state of the memory cell. The READ operation includes a pre-charge stage and a sense stage. During a pre-charge stage, in response to a control signal of reading (not shown), the control signal CHB goes low. As a result, the PMOS device P2 (illustrated in FIG. 1) turns on. As shown in FIG. 2A and FIG. 2B, the voltage of TP V(TP) is charged from a low level and increases rapidly to a high level. When V(TP) is over the trigger point (indicated by a dashed line 208) of the first inverter 102, in accordance with the operation of a flash memory circuit, the control signal CHB goes high. As a result, the PMOS device P2 turns off. Consequently, due to charge sharing effect, V(TP) starts to drop. Subsequently, at a time instance indicated by a dashed line 203, the reference current source $I_{ref}$ is turned on and then starts to charge V(TP).

FIGS. 2A and 2B further illustrate two scenarios in accordance with different logic states stored in the memory cell MCELL. As shown in FIG. 2A and FIG. 2B, when a logic low state is stored in the memory cell MCELL, the cell current $I_{cell}$ is smaller than the reference current $I_{ref}$. As a result, the difference between the reference current $I_{ref}$ and the memory cell current $I_{cell}$ is a positive value, which means a portion of the reference current $I_{ref}$ functions as a charge current and charges V(TP) up slowly as shown by a curve 206. On the other hand, as illustrated by a curve 204 in FIG. 2A and FIG. 2B, when a logic high state is stored in the memory cell MCELL, the cell current $I_{cell}$ is larger than the reference current $I_{ref}$. As a result, the difference between the reference current $I_{ref}$ and the memory cell current $I_{cell}$ is a negative value, which means a portion of the memory cell current $I_{cell}$ functions as a discharge current and discharges V(TP) down slowly as shown by the curve 204.

The first inverter 102 has one trigger point, the trigger point indicated by the dashed line 208 in FIG. 2A and FIG. 2B. In accordance with an embodiment, the trigger point of the first inverter 102 is 0.8V. When the current mode sense amplifier 100 operates in a sense stage, the first inverter 102 functions as a comparator to detect the difference between the reference current and the memory cell current. Based upon the difference between the reference current $I_{ref}$ and the memory cell current $I_{cell}$, the first inverter 102 determines the logic state of the memory cell. More particularly, when the memory cell stores a logic high state, the memory cell current is larger than the reference current, V(TP) is discharged down to a level less than the trigger point of the first inverter 102. As a result, the current mode sense amplifier 100 forwards the logic high state at the output of the first inverter to DOUT (not shown but illustrated in FIG. 1) via the second inverter 104 and the third inverter 106. On the other hand, when the memory cell stores a logic low state, the memory cell current is smaller than the reference current, V(TP) is charged up to a level more than the trigger point of the first inverter 102. As a result, the first inverter 102 generates a logic low and the current mode sense amplifier 100 forwards the logic low state to DOUT via the second inverter 104 and the third inverter 106.

After a predetermined period, the sense amplifier can start to detect the data at the output of the sense amplifier 100. If the predetermined period is longer enough, the sense amplifier will detect a correct result. In contrast, if the predetermined period is short, the sense amplifier will detect an incorrect result due to charge sharing or over pre-charging. More particularly, as shown in FIG. 2A and FIG. 2B, due to different bit line loading or different pass gate size for YMUX, either an charge sharing effect or an over pre-charge effect may occur. For example, when the bit line loading is heavy or the pass gate size of YMUX is small, the sense amplifier may experience a charge sharing effect. As a result, as shown in FIG. 2A, the pre-charge level of V(TP) at the time instance labeled by 203 will be lower than the trigger point (indicated by dashed line 208). On the other hand, when the bit line loading is light or the pass gate size of YMUX is big, the sense amplifier may experience an over pre-charge effect. As a result, as shown in the FIG. 2B, the pre-charge level of V(VTP) at the time instance labeled by 203 will be higher than the trigger point (indicated by dashed line 208).

Figure 3:
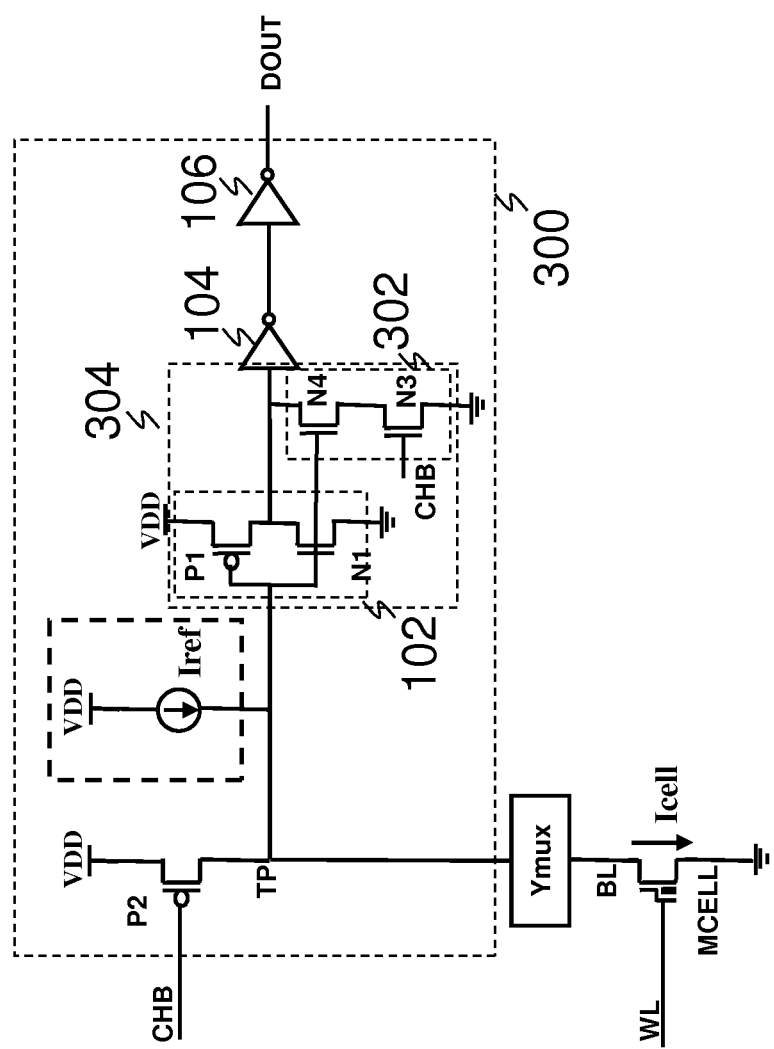
FIG. 3 illustrates a simplified schematic diagram of an exemplified current mode sense amplifier having a dynamic trigger point.

FIG. 3 illustrates a simplified schematic diagram of an exemplified current mode sense amplifier having a dynamic trigger point. The structure of the current mode sense amplifier 300 is similar to that of the current mode sense amplifier 100 shown in FIG. 1 except that an apparatus 302 is connected from the output of the first inverter 102 to ground. More particularly, the apparatus 302 comprises a third NMOS device N3 and a fourth NMOS device N4 connected in series. The third NMOS device N3 has a gate terminal coupled to the control signal CHB, a source terminal connected to ground and a drain terminal connected to a source terminal of the fourth NMOS device N4. The fourth NMOS device N4 has a drain terminal connected to the output of the first inverter 102 and a gate terminal tied to the gate of the first NMOS device N1. As shown in FIG. 3, the first inverter 102 and the apparatus 302 form an inverter 304, which has a dynamic trigger point.

Furthermore, as indicated by a dashed rectangle surrounding the reference current source $I_{ref}$, the reference current source $I_{ref}$ in the current mode sense amplifier 300 is an optional device. The current mode sense amplifier 300 may report a correct logic state of the memory cell without comparing the memory cell current with the reference current. An advantageous feature of removing the reference current source $I_{ref}$ from the current mode sense amplifier 300 is that both the power consumption from the reference current source $I_{ref}$ and the conversion losses from the circuits generating the reference current source $I_{ref}$ are saved so that the total power consumption of the current mode sense amplifier 300 is reduced. In addition, a sense amplifier not having a reference current source may solve some common issues existing in the READ operation of a memory circuit, such as reference current settling time and voltage headroom.

Figure 4B:
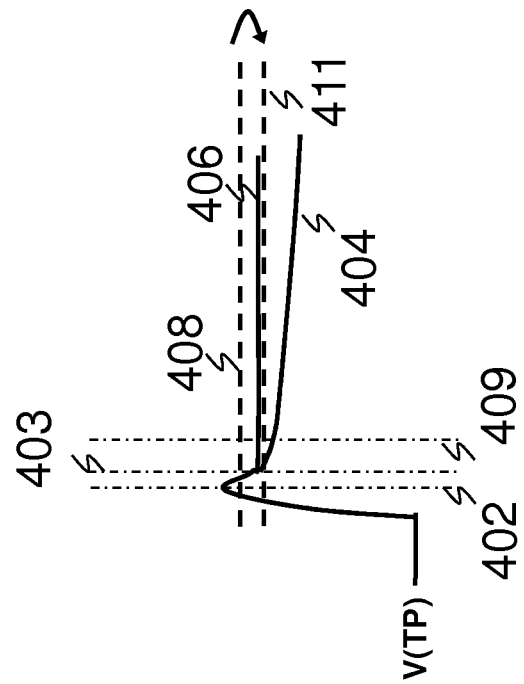
FIGS. 4A and 4B illustrate the operation of the current mode sense amplifier shown in FIG. 3.
Figure 4A:
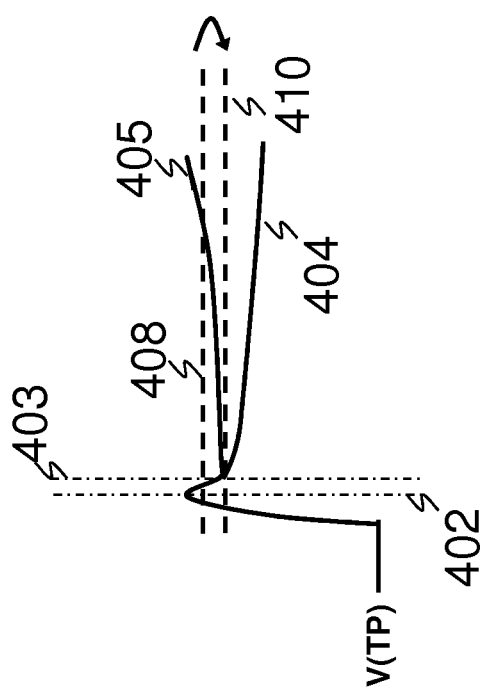

FIGS. 4A and 4B illustrate the operation of the current mode sense amplifier 300 shown in FIG. 3. In a READ operation of a memory cell (e.g., MCELL), during a pre-charge stage, as described above with respect to FIG. 1, the control signal CHB goes low in response to a control signal of reading. The low voltage of the control signal CHB keeps the third NMOS device N3 (illustrated in FIG. 3) off. As a result, the apparatus 302 has no impact on the operation of the current mode sense amplifier 300. That is, the trigger point of the inverter 304 in FIG. 3 is the same as that of the first inverter 102 in FIG. 1. In accordance with an embodiment, the trigger point of the first inverter 102 is 0.8V. Subsequently, after the current mode sense amplifier 300 enters the sense stage, the control signal CHB changes to high. Accordingly, the high voltage at the control signal CHB turns on the third NMOS device N3. As a result, the fourth NMOS device N4 is connected with the first NMOS device N1 in parallel. As known in the art, the fourth NMOS device N4 provides additional current sink capability for the first inverter 102. In accordance with the operation theory of a complementary metal-oxide-semiconductor (CMOS) inverter, the trigger point of the inverter 304 is reduced to a lower voltage level. In accordance with an embodiment, the trigger point of the inverter 304 is approximately 0.7V.

FIGS. 4A and 4B illustrate in detail the operation of the current mode sense amplifier 300 shown in FIG. 3. In comparison with the fixed trigger point shown in FIG. 2, FIGS. 4A and 4B depict a dynamic trigger point resulting from adding the apparatus 302 at the output of the first inverter 102. As shown in FIG. 4A, after the current mode sense amplifier 300 enters the sense stage, the trigger point of the inverter 304 is lowered down from a high level (indicated by a dashed line 408) to a low level (indicated by a dashed line 410). In accordance with an embodiment, the newly established trigger point is 0.7V. Such a low level can be used to reduce the predetermined period for logic state sensing so that the access time can be sped up. When a logic low state is stored in the memory cell MCELL, the memory cell current is relatively small. Therefore, the input of the inverter 304 will be charged to a level higher than the newly established trigger point 410 in a very short time (illustrated by the curve 405). On the other hand, when a logic high state is stored in the memory cell MCELL, the memory cell current is relatively high. Therefore, the input of the inverter 304 is discharged down to a level below the newly established trigger point 410 in a very short time (illustrated by the curve 404).

FIG. 4B illustrates in detail the operation of the current sense amplifier 300 when the reference current source is removed. As shown in FIG. 4B, after the current mode sense amplifier 300 enters the sense stage, the trigger point of the inverter 304 is lowered down from a high level (indicated by a dashed line 408) to a low level (indicated by a dashed line 411). In accordance with an embodiment, the newly established trigger point is 0.65V. At the same time, when a logic low state is stored in the memory cell MCELL, the memory cell current is relatively small. In addition, the reference current source $I_{ref}$ has been removed from the current mode sense amplifier 300. Therefore, the input of the first inverter 102 may remain nearly at a constant voltage level (illustrated by the curve 406). However, due to the discharge from the memory cell current, after a long time period, the VTP voltage may drop below the newly established trigger point. In order to have a reliable result, the sense amplifier 300 may compare the voltage of VTP with the newly established trigger point at a time instance (such as time instance 409) before the voltage of VTP drops below the newly established trigger point. In addition, after the time instance 409, the sense amplifier 300 may be turned off so that the power consumption of the sense amplifier 300 can be saved.

On the other hand, when a logic high state is stored in the memory cell MCELL, the memory cell current is relatively high. Moreover, without the charge balance from the reference current source $I_{ref}$, the input of the first inverter 102 is discharged quickly down to a level below the newly established trigger point 411. An advantageous feature of having the apparatus 302 is that the current mode sense amplifier 300 can quickly determine whether the input of the first inverter is below or above its newly established trigger point voltage so that the total access time of a memory circuit is reduced. In addition, the total power consumption of the memory circuit is reduced too because the reference current source has been removed from the current mode sense amplifier 300.

Figure 5:
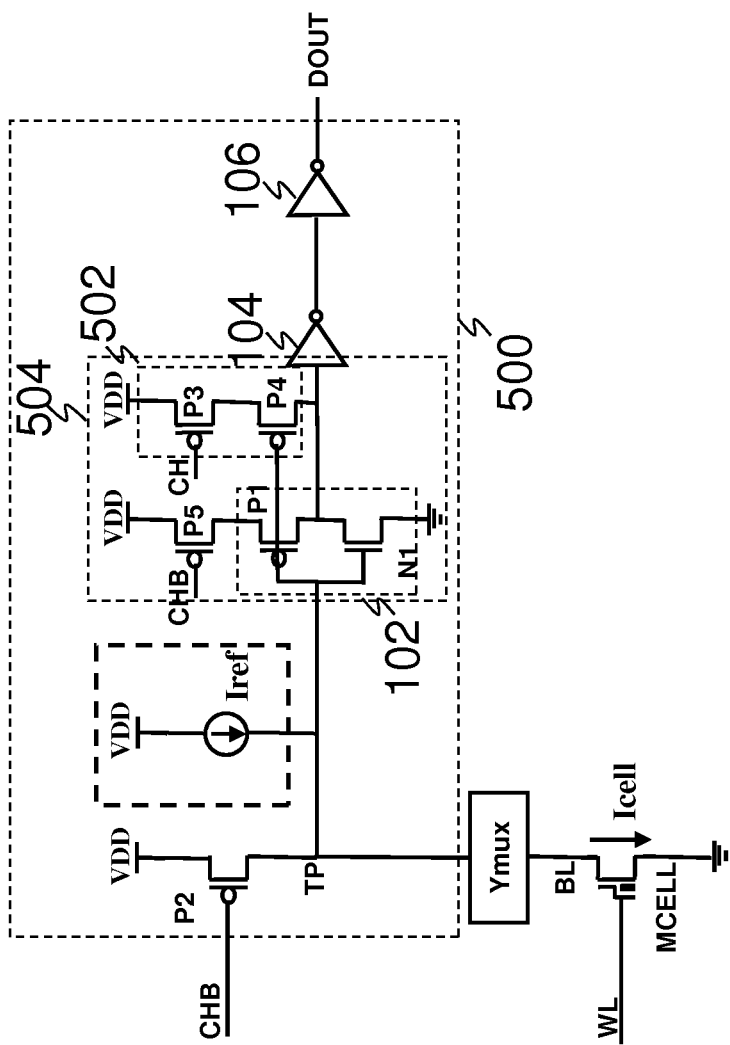
FIG. 5 illustrates an alternative implementation of the current mode sense amplifier having a dynamic trigger point shown in FIG. 3.

FIG. 5 illustrates an alternative implementation of the current mode sense amplifier having a dynamic trigger point shown in FIG. 3. The current mode sense amplifier 500 is similar to that in FIG. 3 except that the current mode sense amplifier 500 comprises an apparatus 502 coupled between the voltage potential VDD and the output of the first inverter 102 and a fifth PMOS device P5 coupled between the voltage potential VDD and the source of the first PMOS device P1. As shown in FIG. 5, the first inverter 102, the apparatus 502 and the fifth PMOS device P5 form an inverter 504. The apparatus 502 comprises a third PMOS device P3 and a fourth PMOS device P4 connected in series. Furthermore, the gate of the third PMOS device P3 is coupled to another control signal CH, which is equivalent to CHB-bar. That is, the logic level of the control signal CH is opposite to that of the control signal CHB.

During a pre-charge stage, as described above with respect to FIG. 1, the control signal CHB goes low. As a result, the fifth PMOS device P5 is turned on and the third PMOS device P3 is turned off. The apparatus 502 has no impact on the trigger point of the first inverter 102 during the pre-charge stage because the third PMOS device P3 is off. Subsequently, after the current mode sense amplifier 500 enters the sense stage, the control signal CHB changes to high, which turns off the fifth PMOS P5. At the same time, the control signal CH changes to low because it is opposite to the logic level of the control signal CHB. The logic low at the control signal CH turns on the third PMOS device P3. In sum, during the sense stage of the current mode sense amplifier 500, the first PMOS device P1 has no impact on the trigger point of the first inverter 102 because the fifth PMOS device P5 is turned off. On the other hand, the fourth PMOS device P4 and the first NMOS device N1 form an inverter in response to the turn-on of the third PMOS device P3.

In accordance with an embodiment, the selection of the first PMOS device P1 and the fourth PMOS device P4 satisfies the following condition:

$$\left(\frac{W_{P1}}{L_{P1}}\right) > \left(\frac{W_{P4}}{L_{P4}}\right)$$

Where $W_{P1}$ and $L_{P1}$ are a width and a length of the channel region of the first PMOS device P1 respectively. $W_{P4}$ and $L_{P4}$ are a width and a length of the channel region of the fourth PMOS device P4 respectively. As known in the art, the condition described above indicates that the fourth PMOS device P4 is a weaker PMOS device in comparison with the first PMOS device P1. Hence, the trigger point of the inverter 504 is reduced to a lower voltage level. As such, both the current mode sense amplifier 500 and the current mode sense amplifier 300 can achieve a dynamic trigger point by lowering the trigger point of the first inverter from a high voltage level to a low voltage level during the sense stage of a READ operation.

An advantageous feature of having the current mode sense amplifier 500 is that the apparatus 502 can further reduce the total power consumption of the current mode sense amplifier 500. In particular, the trigger point change of the current mode sense amplifier 300 relies on the sinking current increase of the NMOS leg of the first inverter 102. In contrast, the trigger point change of the current mode sense amplifier 500 is based upon reducing the sourcing current of the PMOS leg of the first inverter 102. In sum, a dynamic trigger point based upon reducing the sourcing current of an inverter may further improve the total power consumption of a current mode sense amplifier.

Figure 6:
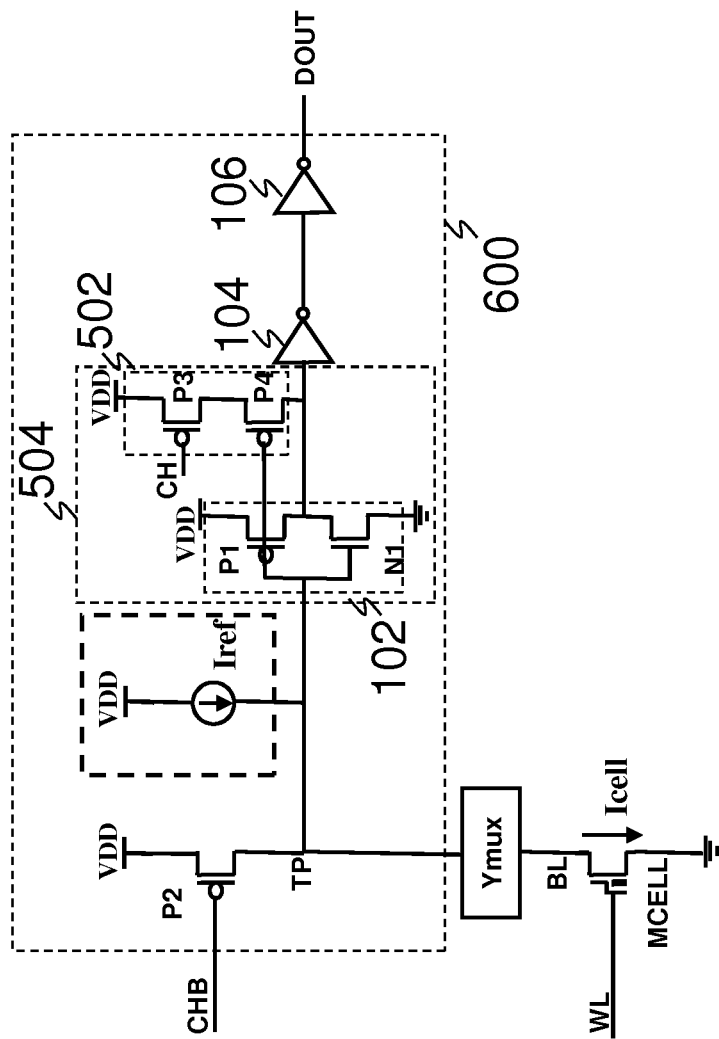
FIG. 6 illustrates a simplified schematic diagram of another exemplified current mode sense amplifier having a dynamic trigger point.
Figure 7A:
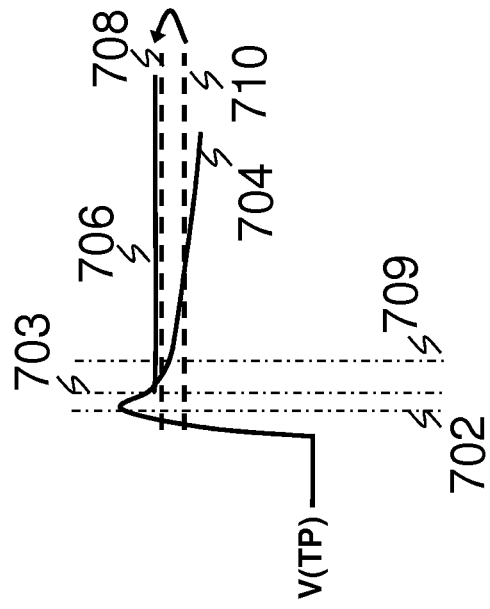
FIGS. 7A and 7B illustrate in detail the operation of the current mode sense amplifier shown in FIG. 6.
Figure 7B:
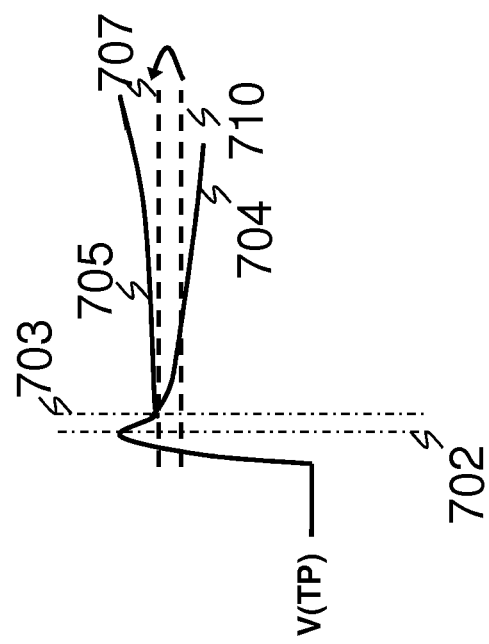

FIG. 6 illustrates a simplified schematic diagram of another exemplified current mode sense amplifier having a dynamic trigger point. The structure of the current mode sense amplifier 600 is similar to that of the current mode sense amplifier 100 shown in FIG. 1 except that the apparatus 502 is connected from the voltage potential VDD and the output of the first inverter 102. FIGS. 7A and 7B illustrate the operation of the current mode sense amplifier 600 shown in FIG. 6. In a READ operation of a memory cell (e.g., MCELL), during a pre-charge stage, as described above with respect to FIG. 1, the control signal CHB goes low in response to a control signal of reading. The control signal CH's logic level is opposite to the logic level of the control signal CHB. That is, the control signal CH goes high when the control signal CHB is low. The high voltage at the control signal CH keeps the third PMOS device P3 off. As a result, the apparatus 502 has no impact on the operation of the current mode sense amplifier 300 during the pre-charge stage. During the pre-charge stage, the trigger point of the first inverter 102 of FIG. 6 is similar to that of the first inverter 102 in FIG. 1. Subsequently, after the current mode sense amplifier 600 enters the sense stage of the READ operation, the control signal CHB changes to high and the control signal CH changes to low accordingly. The low voltage at the control signal CH turns on the third PMOS device P3. As a result, the fourth PMOS device P4 is connected with the first PMOS device P1 in parallel. As known in the art, the fourth PMOS device P4 may provide extra current source capability for the first inverter 102. In accordance with the operation theory of a CMOS inverter, the trigger point of the inverter 504 in FIG. 6 is increased to a higher voltage level.

In comparison with the fixed trigger point shown in FIG. 2, FIGS. 7A and 7B depict a dynamic trigger point resulting from adding the apparatus 502 coupled between the voltage potential VDD and the output of the first inverter 102. As shown in FIG. 7A, after the current mode sense amplifier 600 (illustrated in FIG. 6) enters the sense stage, the trigger point of the inverter 504 (illustrated in FIG. 6) jumps from a low level (indicated by a dashed line 710) to a high level (indicated by a dashed line 707). In accordance with an embodiment, the low level trigger point of the inverter 504 is 0.8V and the high level trigger point of the inverter 504 is 0.9V. When a logic low state is stored in the memory cell MCELL, the memory cell current is relatively small. Therefore, the input of the inverter 504 will be charged to a level higher than the newly established trigger point 707 in a very short time (illustrated by the curve 705). On the other hand, when a logic high state is stored in the memory cell MCELL, the memory cell current is relatively high. Therefore, the input of the inverter 504 is discharged down to a level below the newly established trigger point 707 in a very short time (illustrated by the curve 704).

FIG. 7B illustrates in detail the operation of the current sense amplifier 600 when the reference current source $I_{ref}$ is removed. As shown in FIG. 7B, after the current mode sense amplifier 600 enters the sense stage, the trigger point of the inverter 504 (illustrated in FIG. 6) jumps from a low level (indicated by a dashed line 710) to a high level (indicated by a dashed line 708). In accordance with an embodiment, the low level trigger point of the inverter 504 is 0.8V and the high level trigger point of the inverter 504 is 0.85V. At the same time, when a logic low state is stored in the memory cell MCELL, the memory cell current is relatively small. Moreover, the reference current source $I_{ref}$ has been removed from the current sense amplifier 600. Therefore, the input of the first inverter 102 may remain nearly at a constant voltage level (illustrated by the curve 706). However, due to the discharge from the memory cell current, after a long time period, the VTP voltage may drop below the newly established trigger point. In order to have a reliable result, the sense amplifier may compare the voltage of VTP with the newly established trigger point at a time instance (such as time instance 709) before the voltage of VTP drops below the newly established trigger point. In addition, after the time instance 709, the sense amplifier 600 may be turned off so that the power consumption of sense amplifier 600 can be saved.

On the other hand, when a logic high state is stored in the memory cell MCELL, the memory cell current is relatively high. In addition, without the charge balance from the reference current source $I_{ref}$, the input of the first inverter 102 is discharged quickly down to a level below the newly established trigger point 708. An advantageous feature of having the apparatus 502 coupled between the voltage potential VDD and the output of the first inverter is that the current mode sense amplifier 600 can quickly determine whether the input of the first inverter is below or above its newly established trigger point so that the total access time of a memory circuit is reduced. In addition, the total power consumption of the memory circuit is reduced too because the reference current source has been removed from the current mode sense amplifier 600.

Figure 8:
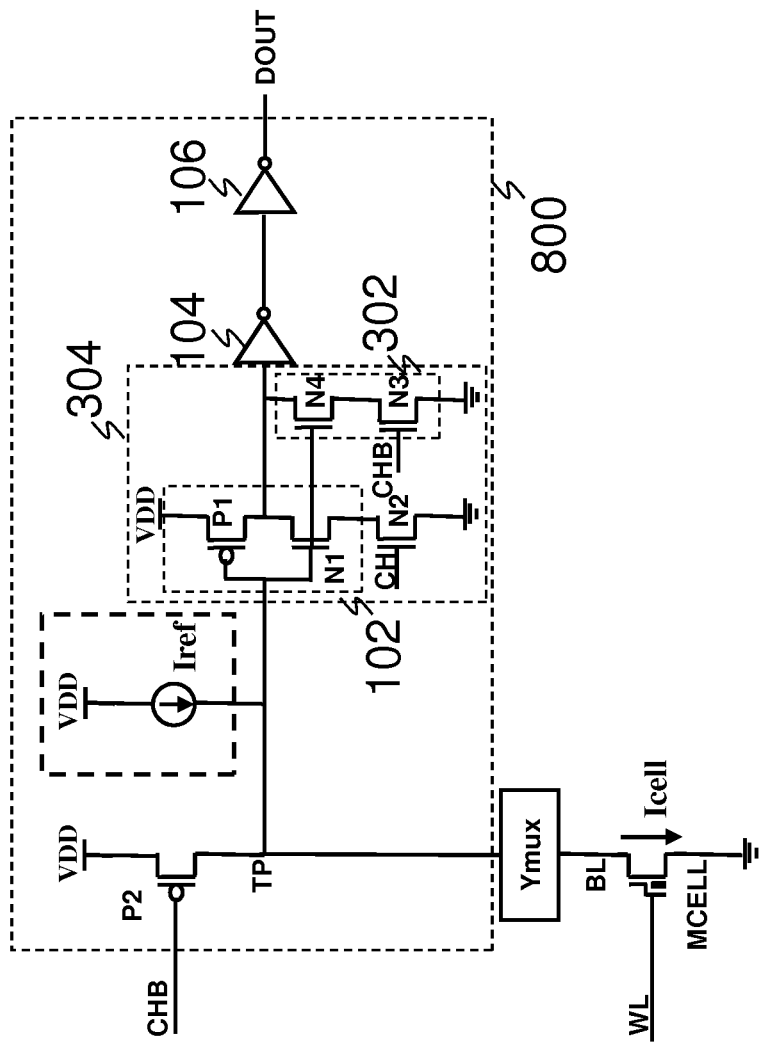
FIG. 8 illustrates an alternative implementation of the current mode sense amplifier having a dynamic trigger point shown in FIG. 6.

FIG. 8 illustrates an alternative implementation of the current mode sense amplifier having a dynamic trigger point shown in FIG. 6. The current mode sense amplifier 800 is similar to that in FIG. 6 except that the current mode sense amplifier 800 comprises an apparatus 302 coupled between the output of the first inverter 102 and ground, and a second NMOS device N2 coupled between the source of the first NMOS device N1 and ground. The gate of the second NMOS device N2 is coupled to the control signal CH.

During a pre-charge stage, as described above with respect to FIG. 1, the control signal CHB goes low and the control signal CH goes high. As a result, the second NMOS device N2 controlled by the control signal CH is turned on and the third NMOS device N3 controlled by the control signal CHB is turned off. Therefore, the apparatus 302 has no impact on the trigger point of the first inverter 102 during the pre-charge stage. Subsequently, after the current mode sense amplifier 800 enters the sense stage, the control signal CHB changes to high, which turns on the third NMOS N3. At the same time, the control signal CH changes to low because the logic level of the control signal CH is opposite to the logic level of the control signal CHB. The logic low at the control signal CH turns off the second NMOS device N2. In sum, during the sense stage of the current mode sense amplifier 800, the first NMOS device N1 has no impact on the trigger point of the first inverter 102 because the second NMOS device N2 is turned off. On the other hand, the fourth NMOS device N4 and the first PMOS device P1 form an inverter in response to the turn-on of the third NMOS device N3.

In accordance with an embodiment, the selection of the first NMOS device N1 and the fourth NMOS device N4 satisfies the following condition:

$$\left(\frac{W_{N1}}{L_{N1}}\right) > \left(\frac{W_{N4}}{L_{N4}}\right)$$

Where $W_{N1}$ and $L_{N1}$ are a width and a length of the channel region of the first NMOS device N1 respectively. $W_{N4}$ and $L_{N4}$ are a width and a length of the channel region of the fourth NMOS device N4 respectively. As known in the art, the condition described above indicates that the fourth NMOS device N4 is a weaker NMOS device in comparison with the first NMOS device N1. Hence, the trigger point of the inverter 304 is increased to a higher voltage level. Similar to the power saving feature of the current mode sense amplifier 500 shown in FIG. 5, a dynamic trigger point based upon reducing the sinking current of an inverter may further improve the total power consumption of a sense amplifier. As such, both the current mode sense amplifier 600 and the current mode sense amplifier 800 can achieve a dynamic trigger point by changing the trigger point of the first inverter from a low voltage level to a high voltage level during the sense stage of a READ operation.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A sense amplifier comprising:
   a first inverter configured to provide a first trigger point during a pre-charge stage of a READ operation of a memory cell and provide a second trigger point different from the first trigger point during a sense stage of the READ operation of the memory cell;
   a pre-charge device having a first terminal coupled to a voltage potential, a second terminal coupled to a first control signal and a third terminal coupled to both an input of the first inverter and the memory cell; and
   a trigger level adjusting apparatus comprising:
      a first MOS device connected in series with the first inverter, wherein a gate terminal of the first MOS device is coupled to:
         the first control signal when the first MOS device is a PMOS device; and
         a second control signal when the first MOS device is an NMOS device, and wherein the second control signal is opposite to the first control signal;
      a second MOS device and a third MOS device connected in series, wherein:
         a gate terminal of the third MOS device is coupled to the input of the first inverter; and
         a gate terminal of the second MOS device is coupled to:
            the second control signal when the second MOS device is a PMOS device; and
            the first control signal when the second MOS device is an NMOS device.

2. The sense amplifier of claim 1, further comprising a plurality of inverters coupled between an output of the first inverter and an output of the sense amplifier.

3. The sense amplifier of claim 1, wherein the second trigger point is lower than the first trigger point.

4. The sense amplifier of claim 1, wherein the second trigger point is higher than the first trigger point.

5. The sense amplifier of claim 1, wherein the first inverter comprises:
   a first P-channel metal-oxide semiconductor (PMOS) device having a source terminal coupled to the voltage potential; and
   a first N-channel metal-oxide semiconductor (NMOS) device having a source terminal coupled to ground, a drain terminal coupled to a drain terminal of the first PMOS device and a gate terminal coupled to a gate terminal of the first PMOS device.

6. The sense amplifier of claim 1, further comprising a reference current source coupled between the voltage potential and the input of the first inverter.

7. The sense amplifier of claim 1, wherein the pre-charge device comprises a PMOS device.

8. A sense amplifier comprising:
   a first inverter;
   a trigger level adjusting apparatus configured to provide a first trigger point of the first inverter during a pre-charge stage of a READ operation of a memory cell and provide a second trigger point of the first inverter during a sense stage of the READ operation of the memory cell, wherein the trigger level adjusting apparatus is coupled to an output of the first inverter; and
   a pre-charge device having a first terminal coupled to a voltage potential, a second terminal coupled to a first control signal and a third terminal coupled to both an input of the first inverter and the memory cell, wherein the trigger level adjusting apparatus comprises:
      a first MOS device connected in series with the first inverter, wherein a gate terminal of the first MOS device is coupled to:
         the first control signal when the first MOS device is a PMOS device; and
         a second control signal when the first MOS device is an NMOS device, and wherein the second control signal is opposite to the first control signal;
      a second MOS device and a third MOS device connected in series, wherein:
         a gate terminal of the third MOS device is coupled to the input of the first inverter; and
         a gate terminal of the second MOS device is coupled to:
            the second control signal when the second MOS device is a PMOS device; and
            the first control signal when the second MOS device is an NMOS device.

9. The sense amplifier of claim 8, wherein:
the first MOS device is a second N-channel metal-oxide semiconductor (NMOS) device having a gate terminal coupled to the second control signal, a source terminal coupled to ground and a drain terminal coupled to a terminal of the first inverter;
the second MOS device is a third NMOS device having a gate terminal coupled to the first control signal and a source terminal coupled to ground; and
the third MOS device is a fourth NMOS device having a gate terminal coupled to the input of the first inverter, a source terminal coupled to a drain terminal of the third NMOS device and a drain terminal coupled to the output of the first inverter.

10. The sense amplifier of claim 8, wherein:
the first MOS device is a second PMOS device having a gate terminal coupled to the first control signal, a source terminal coupled to the voltage potential and a drain terminal coupled to a terminal of the first inverter;
the second MOS device is a third PMOS device having a gate terminal coupled to a second control signal, wherein the second control signal is opposite to the first control signal, and a source terminal coupled to the voltage potential; and
the third MOS device is a fourth PMOS device having a gate terminal coupled to the input of the first inverter, a source terminal coupled to a drain terminal of the third PMOS device and a drain terminal coupled to the output of the first inverter.

\* \* \* \* \*